(12) United States Patent
Chan et al.

(10) Patent No.: US 10,197,877 B2
(45) Date of Patent: Feb. 5, 2019

(54) ARRAY SUBSTRATE AND METHOD FOR MANUFACTURING THE SAME AND DISPLAY DEVICE

(71) Applicant: BOE Technology Group Co., Ltd., Beijing (CN)

(72) Inventors: Yucheng Chan, Beijing (CN); Shuai Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/504,083

(22) PCT Filed: Sep. 9, 2016

(86) PCT No.: PCT/CN2016/098497
§ 371 (c)(1),
(2) Date: Feb. 15, 2017

(87) PCT Pub. No.: WO2017/118073
PCT Pub. Date: Jul. 13, 2017

(65) Prior Publication Data
US 2018/0107080 A1 Apr. 19, 2018

(30) Foreign Application Priority Data
Jan. 5, 2016 (CN) .......................... 2016 1 0007076

(51) Int. Cl.
*G02F 1/13* (2006.01)
*G02F 1/1362* (2006.01)
(Continued)

(52) U.S. Cl.
CPC ...... *G02F 1/136286* (2013.01); *G02F 1/1309* (2013.01); *G02F 1/1368* (2013.01);
(Continued)

(58) Field of Classification Search
CPC ....... G02F 2001/136254; G01F 1/1309; H01L 22/00; H01L 27/3244
See application file for complete search history.

(56) References Cited

U.S. PATENT DOCUMENTS 9,570,365 B2 * 2/2017 Chen ..................... H01L 22/32
2008/0283836 A1 * 11/2008 Lee ..................... H01L 27/3248
257/59

(Continued)

FOREIGN PATENT DOCUMENTS

CN 1532600 9/2004
CN 104345484 A 2/2015
(Continued)

OTHER PUBLICATIONS

International Search Report for PCT/CN2016/098497 dated Dec. 12, 2016.
(Continued)

*Primary Examiner* — Stephen Bradley
(74) *Attorney, Agent, or Firm* — Calfee, Halter & Griswold LLP (57) ABSTRACT

An array substrate includes multiple pattern layers disposed in a display region and a test unit disposed in a non-display region, the test unit includes at least one of a test component and a test transistor. The test component includes a test block pattern and a test line pattern; the test block pattern is disposed in the same layer as one layer of the multiple pattern layers, the test line pattern is disposed in the same layer as one layer of the multiple pattern layers, and the test block pattern and the test line pattern are disposed in different layers; the orthographic projection of the test line pattern on the array substrate surrounds the periphery of the orthographic projection of the test block pattern on the array substrate; and the test block pattern or the test line pattern is connected to the test transistor.

18 Claims, 4 Drawing Sheets

(51) Int. Cl.
  *H01L 21/77*  (2017.01)
  *H01L 27/12*  (2006.01)
  *G02F 1/1343*  (2006.01)
  *G02F 1/1368*  (2006.01)

(52) U.S. Cl.
  CPC ........ *G02F 1/134363* (2013.01); *H01L 21/77* (2013.01); *H01L 27/12* (2013.01); *H01L 27/1214* (2013.01)

(56) References Cited

U.S. PATENT DOCUMENTS

| | | | |
|---|---|---|---|
| 2009/0207369 A1* | 8/2009 | Lin | G02F 1/13452 349/152 |
| 2014/0184969 A1* | 7/2014 | Ro | G02F 1/136286 349/43 |
| 2014/0346511 A1 | 11/2014 | Wu et al. | |

FOREIGN PATENT DOCUMENTS

| | | |
|---|---|---|
| CN | 104425559 | 3/2015 |
| CN | 104576615 | 4/2015 |
| CN | 105206601 | 12/2015 |
| CN | 105206624 A | 12/2015 |
| CN | 105632959 | 6/2016 |
| KR | 20080037343 | 4/2008 |

OTHER PUBLICATIONS

Chinese Office Action to Chinese Patent Application No. 201610007076.6, dated Dec. 5, 2017.

* cited by examiner

ARRAY SUBSTRATE AND METHOD FOR MANUFACTURING THE SAME AND DISPLAY DEVICE

CROSS-REFERENCE TO RELATED APPLICATIONS

The present application is based on International Application No. PCT/CN2016/098497, filed on Sep. 9, 2016, which is based upon and claims priority to Chinese Patent Application No. 201610007076.6, filed on Jan. 5, 2016, and the entire contents thereof are incorporated herein by reference.

TECHNICAL FIELD

The present disclosure relates to the technical field of display, and more particularly to an array substrate, a method for manufacturing the same, and a display device.

BACKGROUND

As demands for displays with high-resolution are increasingly high, requirements on process capacity of a high-resolution display product are also getting higher and higher. Therefore, requirements on time effectiveness of testing the process capability in the process of manufacturing displays are increased.

Especially for a polysilicon display device, such as a top gate type polysilicon display, the process is complicated due to multiple times of exposure in the process of manufacturing displays. If a defective of process cannot be immediately detected in the manufacturing process, it may cause a great waste in the cost and time of manufacturing. Thus, monitoring for the stability and accuracy of the process needs to be performed in the process or after the end of the process.

Currently, during the monitoring for the stability and accuracy of process in the process of manufacturing a display product, a test unit is typically fabricated in a non-display region of the display product. A width of a signal line and an overlapping between a upper conducting film and a lower conducting film in the test unit are detected, to detect the stability and accuracy of the process of manufacturing each of film layers in a display region. Moreover, the performance of a transistor in the display region can be detected by testing characteristics of a long channel transistor and a short channel transistor in the test unit, so that the defective in the process can be found timely by the test unit to reduce the waste in the manufacturing cost.

In the existing test unit, multiple test elements are disposed in different layers of the non-display region. Among these test elements, the test element for testing the width of the signal line, the test element for testing the overlapping between a upper conducting film and a lower conducting film, and the element for testing the characteristic of a long channel transistor and a short channel transistor are provided independently. These test elements are dispersedly distributed in the non-display region. Therefore, a large space in the non-display region is occupied by the test elements. It is disadvantageous for saving the manufacturing cost. Moreover, it needs to move testing equipment (such as optical testing equipment and electrical testing equipment) frequently to test different process parameters. The test efficiency is reduced greatly while the test cost is also increased.

It should be noted that, information disclosed in the above background portion is provided only for better understanding of the background of the present disclosure, and thus it may contain information that does not form the prior art known by those ordinary skilled in the art.

SUMMARY

The present disclosure provides an array substrate, a method for manufacturing the same, and a display device.

Embodiments of the present disclosure provide an array substrate, including multiple pattern layers disposed in a display region and a test unit disposed in a non-display region. The test unit includes at least one test component and at least one test transistor, and the test component includes a test block pattern and a test line pattern. The test block pattern is disposed in the same layer as one layer of the multiple pattern layers, the test line pattern is disposed in the same layer as one layer of the multiple pattern layers, and the test block pattern and the test line pattern are disposed in different layers. An orthographic projection of the test line pattern on the array substrate surrounds the periphery of an orthographic projection of the test block pattern on the array substrate. The test block pattern or the test line pattern is connected to the test transistor.

Embodiments of the present disclosure also provide a display device, including the above described array substrate.

The present disclosure also provides a method for manufacturing the above described array substrate, including forming multiple pattern layers in a display region and forming a test unit in a non-display region. Forming the test unit includes forming at least one test component and at least one test transistor, and forming the test component includes forming a test block pattern and a test line pattern. The test block pattern and one layer of the multiple pattern layers are formed by a one-time patterning process, the test line pattern and one layer of the multiple pattern layers are formed by a one-time patterning process, and the test block pattern and the test line pattern are formed in different layers. The orthographic projection of the test line pattern on the array substrate surrounds the periphery of the orthographic projection of the test block pattern on the array substrate, and the test block pattern or the test line pattern is connected to the test transistor.

DETAILED DESCRIPTION

In order that those skilled in the art will better understand the technical solutions of the present disclosure, an array substrate, a method for manufacturing the same, and a display device provided by the present disclosure will be described in further detail with reference to the accompanying drawings and detailed description.

Figure 1:
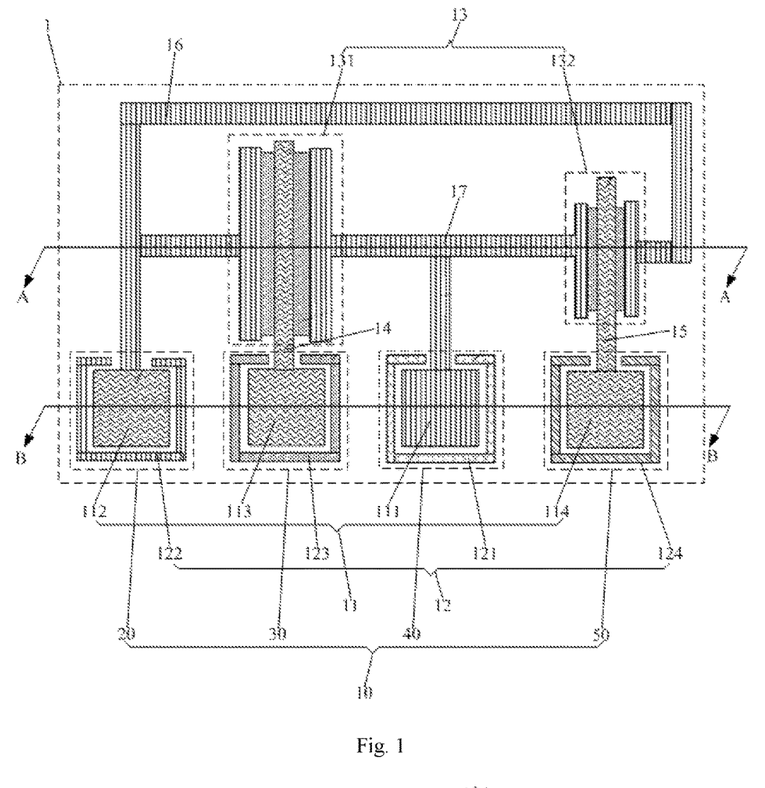
FIG. 1 is a top view of the structure of a test unit on an array substrate according to an embodiment of the present invention.
Figure 2:
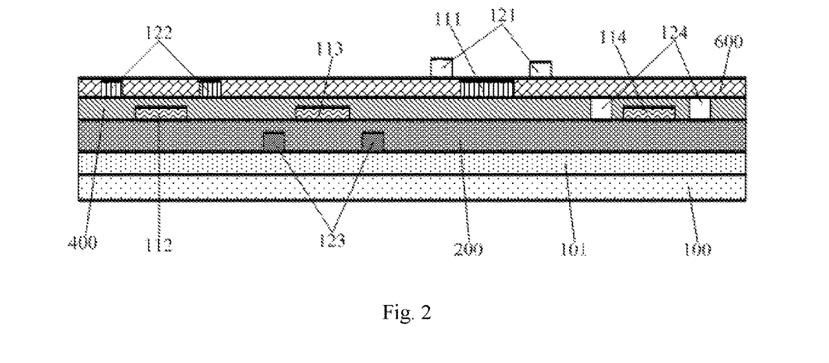
FIG. 2 is a cross-sectional view of the structure of the array substrate taken along the line BB in FIG. 1.

As shown in FIGS. 1 and 2, one embodiment of the present disclosure provides an array substrate including multiple pattern layers disposed in a display region and a test unit 1 disposed in a non-display region. The test unit 1 includes at least one test component 10 and at least one test transistor 13. The test component 10 includes a test block pattern 11 and a test line pattern 12. The test block pattern 11 is disposed in the same layer as one layer of the multiple pattern layers. The test line pattern 12 is disposed in the same layer as one layer of the multiple pattern layers. The test block pattern 11 and the test line pattern 12 are disposed in different layers. An orthographic projection of the test line pattern 12 on the array substrate surrounds the periphery of an orthographic projection of the test block pattern 11 on the array substrate. The test block pattern 11 is connected to the test transistor 13.

In the present embodiment, the orthographic projection of the test line pattern 12 on the array substrate is spaced from the orthographic projection of the test block pattern 11 on the array substrate. That is, the orthographic projection of the test line pattern 12 on the array substrate is completely separated from the orthographic projection of the test block pattern 11 on the array substrate, so that it is ensured that an overlapping can be detected accurately by the test line pattern 12 and the test block pattern 11. It should be noted that it may suffice to just make sure that the orthographic projection of at least a part of the pattern on the test line pattern 12 on the array substrate is spaced from the orthographic projection of the test block pattern 11 on the array substrate.

The orthographic projection of the test line pattern 12 on the array substrate surrounds the periphery of orthographic projection of the test block pattern 11 on the array substrate.

It should be noted that the test block pattern may be a rectangular block pattern, a polygonal block pattern, a circular block pattern, or the like. The present embodiment will be described by taking a rectangular block pattern as an example. The orthographic projection of the test line pattern 12 can surround the orthographic projection periphery of the test block pattern 11 in an arbitrary shape. For example, the test line pattern 12 may be provided as a continuous surrounding pattern or as a discontinuous surrounding pattern.

It should be noted that, in the present embodiment, the test line pattern 12 also may be set to be connected to the test transistor 13. Whether the test block pattern 11 or the test line pattern 12 is connected to the test transistor 13, the connection is to provide a corresponding gate/source/drain test signal to the test transistor 13. Since the area of the test line pattern 12 is smaller than the area of the test block pattern 11, the test signal is more difficult to be introduced via the test line pattern 12 during testing. Therefore, the test signal is normally introduced into the test transistor 13 via the test block pattern 11. That is, the test block pattern 11 is normally set to be connected to the test transistor 13.

In the present embodiment, the test line pattern 12 and the test block pattern 11 are disposed in the test component 10. This arrangement can test respectively whether the pattern sizes of the multiple pattern layers in the display region satisfy design and process requirements. Whether the degree of overlapping between two layers of the multiple pattern layers disposed on the different layers in the display region meets the design and process requirements can be tested through the distance between the orthographic projection of the test line pattern 12 on the array substrate and the orthographic projection of the test block pattern 11 on the array substrate. The pattern sizes of the multiple pattern layers and the degree of overlapping between two layers of the multiple pattern layers are obtained through optical testing performed by an optical test apparatus. The test transistor 13 can test whether the characteristics of the transistors used to control the display in the display region meet the design and process requirements. The test characteristics of the transistor in the display region are obtained through the electrical testing performed by the electrical testing equipment. By the test unit 1, it is possible to detect process level of forming each of the pattern layers in the display region, to detect defects occurring in the manufacturing process, and to modify the defects timely, thereby greatly saving the cost in the process of manufacturing the array substrate. The stability and accuracy of the process for forming each of the films in the array substrate can be ensued, thus quality of the process for forming each of the films in the array substrate can be ensued.

In the test unit 1 of the present embodiment, an integration test of the pattern sizes of the multiple pattern layers and the degree of overlapping between two layers of the multiple pattern layers in the display region can be realized by disposing the orthographic projection of the test line pattern 12 on the array substrate surrounding the periphery of the orthographic projection of the test block pattern 11 on the array substrate and the orthographic projection of the test line pattern 12 on the array substrate be spaced from the orthographic projection of the test block pattern 11 on the array substrate. That is, the above-described integrated arrangement of the test block pattern 11 and the test line pattern 12 enables the test of process parameters including the pattern size of each of the pattern layers in the display region and the degree of overlapping between different pattern layers. Moreover, an integration test of the transistor characteristics in the display region can be achieved by connecting the test transistor 13 to the test block pattern 11. That is, by the above-described integrated arrangement of the test block pattern 11 and the test transistor 13, the test of the process parameters of the transistor characteristic in the display region may be achieved. Thereby, the process performance of each of the pattern layers in the display region can be tested without setting more independent test elements, thereby saving the space occupied by the test unit 1 in the non-display region and reducing the test cost. Moreover, with an integration arrangement of the test block pattern 11, the test line pattern 12 and the test transistor 13 in the test unit 1, during a test performed by the test unit 1 using test equipment, various performance of the array substrate can be effectively tested without moving the test equipment frequently, thereby improving the time effectiveness of the test.

The multiple pattern layers include at least two pattern layers of a source/drain electrode layer, a transparent electrode layer, a gate electrode layer, an active layer, and a dielectric layer, and the at least two pattern layers are provided in different layers. In the present embodiment, the multiple pattern layers include a source/drain electrode layer (which is located in the same layer as a source/drain metal layer 500 described later), a gate electrode layer (which is located in the same layer as a gate metal layer 300 described later), and an active layer (which is located in the same layer as an active layer thin film 102 described later).

In the present embodiment, the test unit 1 includes a first test component 20 including a first test block pattern 112 and a first test line pattern 122. The first test block pattern 112 is disposed in the same layer as the gate electrode layer. The first test line pattern 122 is disposed in the same layer as the source/drain electrode layer. In this way, not only the pattern sizes of the gate layer and the source/drain electrode layer in the display region but also the degree of overlapping between the gate electrode layer and the source/drain electrode layer in the display region can be tested, thus the process of forming the gate electrode layer and the source/drain electrode layer in the display region can be timely and effectively monitored.

In the present embodiment, the test unit 1 further includes a second test component 30 including a second test block pattern 113 and a second test line pattern 123. The second test block pattern 113 is disposed in the same layer as the gate electrode layer. The second test line pattern 123 is disposed in the same layer as the active layer. In this way, not only the pattern size of the gate electrode layer and the active layer in the display region but also the degree of overlapping between the gate electrode layer and the active layer in the display region can be tested, thus the process of forming the gate layer and the active layer in the display region can be timely and effectively monitored.

In the present embodiment, the multiple pattern layers further includes a transparent electrode layer. The test unit 1 further includes a third test component 40 including a third test block pattern 111 and a third test line pattern 121. The third test block pattern 111 is disposed in the same layer as the source/drain electrode layer. The third test line pattern 121 is disposed in the same layer as the transparent electrode layer. In this way, not only the pattern sizes of the source/drain electrode layer and the transparent electrode layer in the display region but also the degree of overlapping between the source/drain electrode layer and the transparent electrode layer in the display region can be tested, thus the process of forming the source/drain electrode layer and the transparent electrode layer in the display region can be timely and effectively monitored. The transparent electrode layer may be a pixel electrode layer. It should be noted that the transparent electrode layer may also be a common electrode layer.

In the present embodiment, the multiple pattern layers further include a dielectric layer. The test unit 1 further includes a fourth test component 50 including a fourth test block pattern 114 and a fourth test line pattern 124. The fourth test block pattern 114 is disposed in the same layer as the gate electrode layer. The fourth test line pattern 124 is disposed in the same layer as the dielectric layer. In this way, not only the pattern sizes of the gate electrode layer and the dielectric layer in the display region but also the degree of overlapping between the gate electrode layer and the dielectric layer in the display region can be tested, thus the process of forming the gate electrode layer and the transparent electrode layer in the display region can be timely and effectively monitored.

In the present embodiment, the orthographic projections of multiple test components 10 in the test unit 1 on the array substrate are spaced from one another and arranged in a row. That is, the orthographic projection of the first test component 20 on the array substrate, the orthographic projection of the second test component 30 on the array substrate, the orthographic projection of the third test component 40 on the array substrate, and the orthographic projection of the fourth test component 50 on the array substrate are spaced from one another and arranged in a row. In this way, an integrated arrangement of the plurality of test components 10 is achieved. When a test is performed, test light is irradiated to respective test block patterns 11 and respective test line patterns 12 by the optical test apparatus, so as to detect the pattern sizes of respective tested films and the degree of overlapping between tested films in different layers in the display region, thus test cost is saved and test efficiency is improved.

In the present embodiment, the test transistor 13 includes a first test transistor 131 and a second test transistor 132. The channel size of the first test transistor 131 is different from that of the second test transistor 132. The channel size includes any one of a length, a width, and a width-to-length ratio. The test unit 1 further includes a first gate connection line 14 connected to the gate electrode of the first test transistor 131 and a second gate connection line 15 connected to the gate electrode of the second test transistor 132. The second test block pattern 113 is connected to one of the first gate connection line 14 and the second gate connection line 15. The fourth test block pattern 114 is connected to the other of the first gate connection line 14 and the second gate connection line 15. In FIG. 1, the second test block pattern 113 is connected to the first gate connection line 14. The fourth test block pattern 114 is connected to the second gate connection line 15.

In the present embodiment, the test unit 1 further includes a source connection line 16 connected to the source electrodes of the first test transistor 131 and the second test transistor 132 and a drain connection line 17 connected to the drain electrodes of the first test transistor 131 and the second test transistor 132. The first test block pattern 112 is connected to one of the source connection line 16 and the drain connection line 17. The third test block pattern 111 is connected to the other of the source connection line 16 and the drain connection line 17. In FIG. 1, the first test block pattern 112 is connected to the source connection line 16. The third test block pattern 111 is connected to the drain connection line 17.

The first test transistor 131 can be used to test the characteristic of a transistor in the display region whose channel size is the same as that of the first test transistor 131. The second test transistor 132 can be used to test the characteristic of a transistor in the display region of which channel size is the same as that of the second test transistor 132, so as to test whether the process parameters in the manufacturing process of the transistors in the display region meet requirements, thus the process of manufacturing the transistors in the display region can be timely and effectively monitored.

It should be noted that, the channel of the transistor refers to an active layer region between the source electrode region and the drain electrode region under an effect of an externally applied electric field. The channel size is one of the parameters that characterize the performance of a transistor, including a length of the channel, a width of the channel, a width-to-length ratio of the channel.

During the test, electrical test signals are applied to the first test block pattern 112, the second test block pattern 113 and the fourth test block pattern 114, respectively, by means of an electrical testing equipment, thereby providing the first test transistor 131 and the second test transistor 132 with inputted gate electrode test signals and source electrode test signals, and outputting a signal from the third test block pattern 111 to the electrical testing equipment so as to perform electrical performance tests on the first test transistor 131 and the second test transistor 132. By an integrated arrangement of the test block pattern 11 and the test transistor 13, the electrical testing signals can be applied to the testing transistors to perform test without frequently moving the electrical testing equipment during the test, thus for the test unit 1, an integration of the electrical testing and the optical testing can be achieved, which not only saves test cost, but also improves test efficiency.

In the present embodiment, the active layers of the first test transistor 131 and the second test transistor 132 are disposed in the same layer as the active layer in the display region. The gate electrodes of the first test transistor 131 and the second test transistor 132, the first gate connection line 14 and the second gate connection line 15 are disposed in the same layer as the gate layer in the display region. The source electrodes, the drain electrodes of the first test transistor 131 and the second test transistor 132, the source connection line 16 and the drain connection lines 17 are disposed in the same layer as the source/drain electrode layer in the display region. In this way, the test transistor 13 can be formed in the display region while a transistor is formed in the display region without performing additional manufacturing process step, thus the manufacturing cost of the test unit 1 is reduced.

It should be noted that, in the present embodiment, the source/drain electrode layer is disposed above the gate layer, and a dielectric layer 400 is disposed between the source/drain electrode layer and the gate electrode layer. Accordingly, as shown in FIG. 2, the first test line pattern 122 is located above the first test block pattern 112. The source connection line 16 is disposed in the same layer as the first test line pattern 122. The source connection line 16 is connected to the first test block pattern 112 through a via hole (not shown in FIG. 2) provided in the dielectric layer. In the present embodiment, for the case that the thickness of the dielectric layer 400 is large, when the size of the block test pattern is large, the size of the linear test pattern is small and the block test pattern is located below the dielectric layer 400, the accuracy of alignment between the block test pattern and the line test pattern may be tested using light to illuminate the block test pattern and the line test pattern, the block test pattern located below the dielectric layer 400 can be more easily seen, and thus alignment detection can be more accurate.

On the basis of the above described structure of the array substrate in the present embodiment, the present embodiment also provides a method of manufacturing the array substrate, including forming multiple pattern layers in the display region and forming a test unit in the non-display region. Forming the test unit includes forming at least one of a test component and a test transistor. Forming a test component includes forming a test block pattern and a test line pattern. The test block pattern and one of the multiple pattern layers are formed in a one-time patterning process, the test line pattern and one of the multiple pattern layers are formed in a one-time patterning process. The test block pattern and the test line pattern are formed in different layers. The orthographic projection of the test line pattern on the array substrate surrounds the periphery of orthographic projection of the test block pattern on the array substrate. The orthographic projection of the test line pattern on the array substrate is spaced from the orthographic projection of the test block pattern on the array substrate. The test block pattern is connected to the test transistor. For example, the test block pattern may be formed with the same material as one of the multiple pattern layers and the test block pattern and said multiple pattern layer are formed in a one-time patterning process to simplify the process flow. For example, the test line pattern may be formed with the same material as the other layer of the multiple pattern layers and the test block pattern and said multiple pattern layers are formed in a one-time patterning process to simplify the process flow.

Hereinafter, a specific forming step of the test unit in the non-display region of the array substrate will be described with reference to FIGS. 2 to 15, taking a top gate type polysilicon array substrate as an example.

Figure 3:
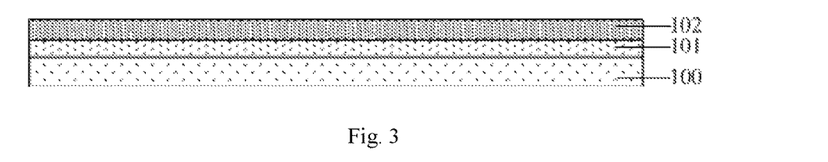
FIG. 3 is a cross-sectional view of the structure of the array substrate taken along the line AA after a buffer layer and an active layer are formed.

A substrate 100 is subjected to a cleaning process, and the substrate 100 is made of a transparent material such as glass. A buffer layer 101 and an amorphous silicon active layer thin film 102 are sequentially formed on the substrate 100 by means of plasma enhanced chemical vapor deposition, as shown in FIG. 3. The buffer layer 101 is a single layer or a composite layer, which is formed of silicon oxide and/or silicon nitride. The thickness of the silicon oxide ranges from 50 nm to 100 nm. The thickness of the silicon nitride ranges from 100 nm to 300 nm. The thickness of the amorphous silicon film ranges from 40 nm to 50 nm. Next, the substrate 100 is subjected to treatment in a high-temperature furnace for dehydrogenation (reducing the amount of hydrogen in the amorphous silicon film), and the content of hydrogen is generally controlled to 2% or less.

Figure 4:
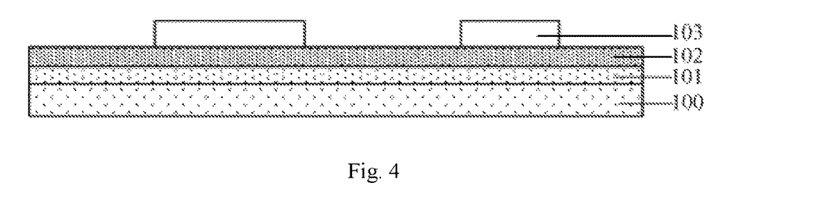
FIG. 4 is a cross-sectional view of the structure of the array substrate taken along the line AA after a photoresist is exposed and developed.

An ELA (Excimer Laser Anneal) process is performed on the substrate after completing the above steps to convert the amorphous silicon active layer thin film 102 into a polysilicon active layer thin film 102, and then the polysilicon active layer thin film 102 is exposed and developed to form a pattern photoresist 103 corresponding to a first test transistor and a second test transistor and a photoresist pattern corresponding to the second test line pattern 123, as shown in FIGS. 2 and 4.

Figure 5:
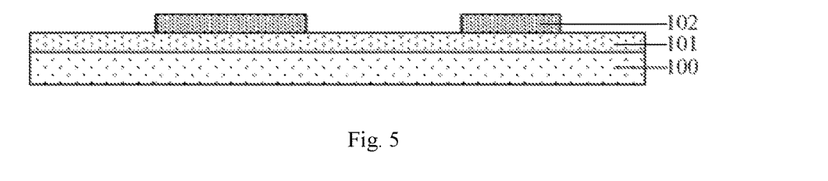
FIG. 5 is a cross-sectional view of the structure of the array substrate taken along the line AA after an active layer is etched and a photoresist is peeled off.

An active layer is etched by means of etching, and then the photoresist on the active layer pattern and the photoresist on the second test line pattern 123 are peeler off to form the patterns of the active layers of the first test transistor and the second test transistor and the pattern of the second test line patter 123, as shown in FIGS. 2 and 5.

Figure 6:
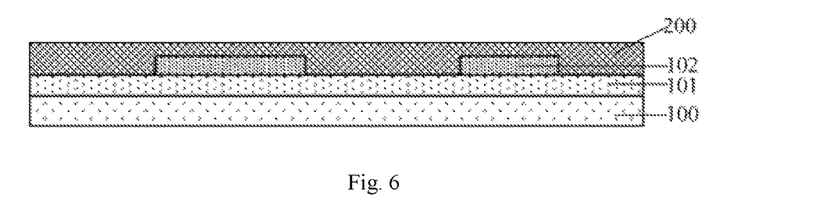
FIG. 6 is a cross-sectional view of the structure of the array substrate taken along the line AA after a gate insulating layer is formed.

A gate insulating layer 200 is deposited by means of plasma enhanced chemical vapor deposition, as shown in FIG. 6.

Figure 7:
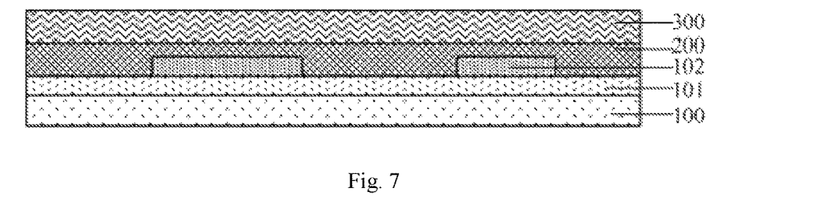
FIG. 7 is a cross-sectional view of the structure of the array substrate taken along the line AA after a gate metal layer is formed.
Figure 8:
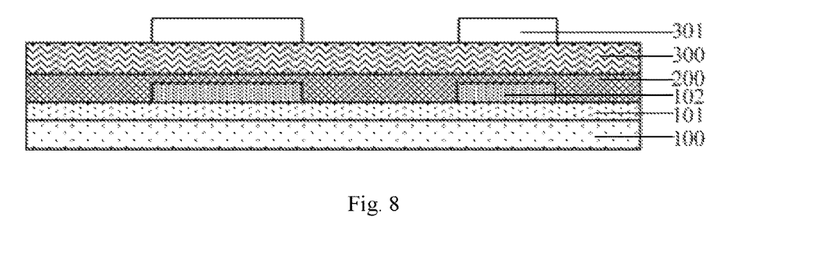
FIG. 8 is a cross-sectional view of the structure of the array substrate taken along the line AA after a photoresist is exposed and developed.
Figure 9:
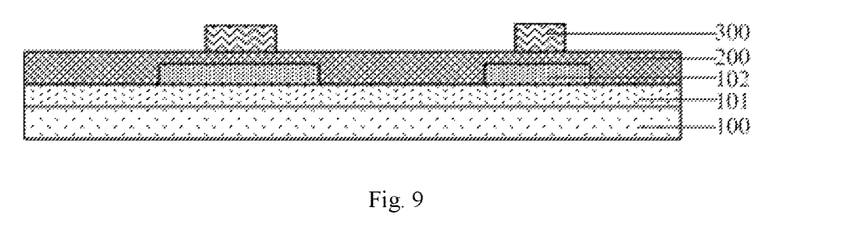
FIG. 9 is a cross-sectional view of the structure of the array substrate taken along the line AA after a gate metal layer is etched and a photoresist is peeled off.

A gate metal layer 300 is deposited by sputtering, as shown in FIG. 7. A photoresist pattern 301 corresponding to gate electrodes of the first test transistor and the second test transistor, a photoresist pattern corresponding to the first test block pattern 112, a photoresist pattern corresponding to the second test block pattern 113, a photoresist pattern corresponding to the fourth test block pattern 114, a photoresist pattern (not shown) corresponding to the first gate connection line 14, and a photoresist pattern (not shown) corresponding to the second gate connection line 15 are formed by exposure and development, as shown in FIGS. 2 and 8. The region of the gate metal layer which is not coated by the photoresist is then etched by means of etching, and the photoresist on the gate pattern is peeled off to form the patterns of the gate electrodes of the first test transistor and the second test transistor, the pattern of the first test block pattern 112, the pattern of the second test block pattern 113, the pattern of the fourth test block pattern 114, the pattern of the first gate connection line 14 and the pattern (not shown) of the second gate connection line 15, as shown in FIGS. 2 and 9.

Figure 10:
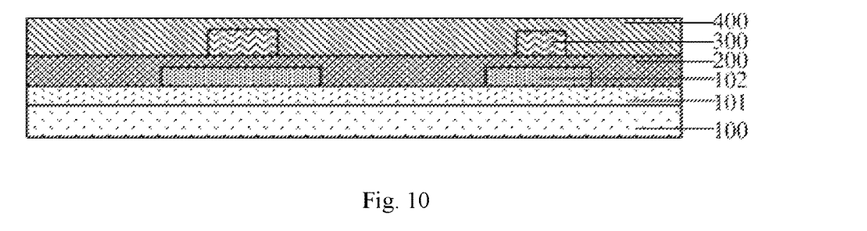
FIG. 10 is a cross-sectional view of the structure of the array substrate taken along the line AA after a dielectric layer is formed.
Figure 11:
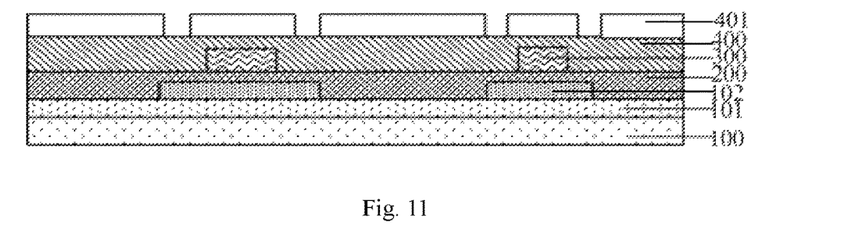
FIG. 11 is a cross-sectional view of the structure of the array substrate taken along the line AA after a photoresist is exposed and developed.
Figure 12:
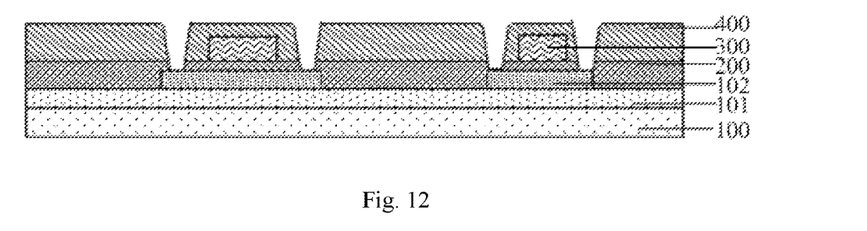
FIG. 12 is a cross-sectional view of the structure of the array substrate taken along the line AA after a dielectric layer and a gate metal layer are etched and a photoresist is peeled off.

A dielectric layer 400 is deposited by means of plasma enhanced chemical vapor deposition, as shown in FIG. 10. After the formation of the dielectric layer, a photoresist pattern 401 corresponding to the via hole in the dielectric layer and a photoresist pattern corresponding to the fourth test line pattern 124 are formed by exposure and development, as shown in FIGS. 2 and 11. The region of the dielectric layer 400 which is not coated by the photoresist is then etched by means of etching, and the photoresist corresponding to the via hole in the dielectric layer 400 and the photoresist corresponding to the fourth test line pattern 124 are peeled off to form a pattern of the via hole and the fourth test line pattern 124, as shown in FIGS. 2 and 12.

Figure 13:
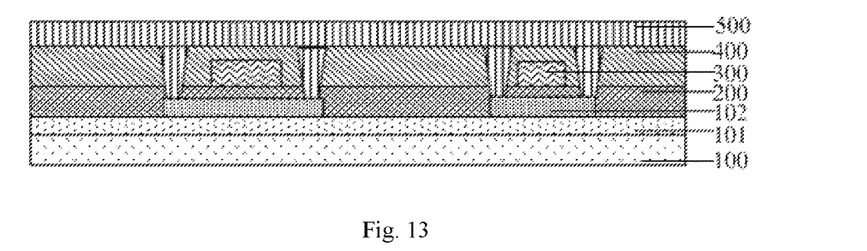
FIG. 13 is a cross-sectional view of the structure of the array substrate taken along the line AA after a source/drain electrode metal layer is formed.
Figure 14:
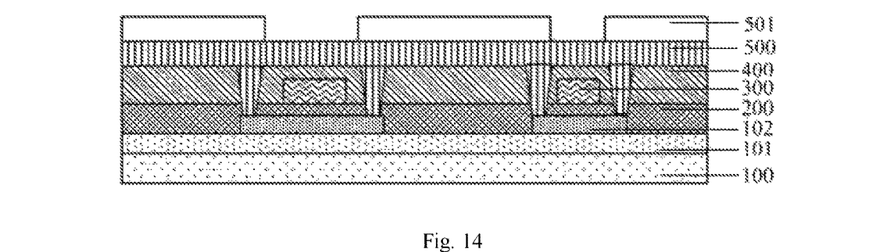
FIG. 14 is a cross-sectional view of the structure of the array substrate taken along the line AA after a photoresist is exposed and developed.

A source/drain electrode metal layer 500 is deposited by means of sputtering, as shown in FIG. 13. Then a photoresist patterns 501 corresponding to the source/drain electrodes of the first test transistor and the second test transistor, a photoresist pattern corresponding to the first test line pattern 122, a photoresist pattern (not shown) corresponding to the source electrode connection line 16, and a photoresist pattern (not shown) corresponding to the drain electrode connection line 17 are formed by exposure and development, as shown in FIGS. 2 and 14.

Figure 15:
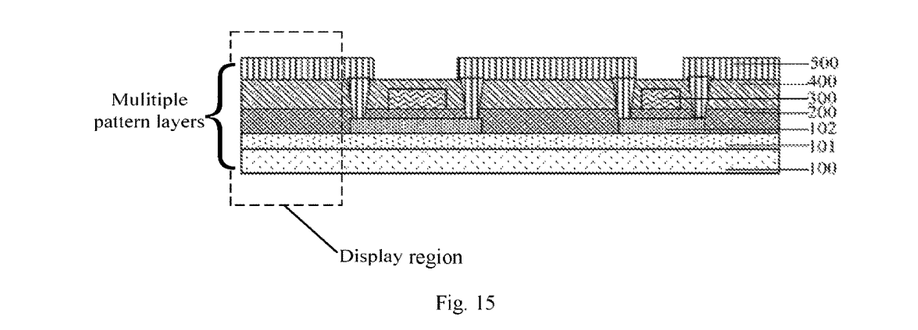
FIG. 15 is a cross-sectional view of the structure of the array substrate taken along the line AA after a source/drain electrode metal layer is etched and a photoresist is lifted off.

The region of the source/drain electrode metal layer which is not coated by the photoresist is etched by means of etching, the photoresist on the source/drain electrode, the photoresist on the first test line pattern 122, the photoresist on the source electrode connection line 16, the photoresist on the drain electrode connection line 17 are peeled off to form patterns of the source electrodes and drain electrodes of the first test transistor and the second test transistor, a pattern of the first test line pattern 122, a pattern of to the source electrode connection line 16, and a pattern of the source electrode connection line 17, as shown in FIG. 15.

A passivation layer is deposited by means of plasma enhanced chemical vapor deposition. Next, a transparent electrode layer (that is a pixel electrode layer) is deposited by means of sputtering. A photoresist pattern corresponding to the third test line pattern 121 is formed by exposure and development, the region of the pixel electrode layer which is not coated by the photoresist is etched by means of etching, and the photoresist on the third test line pattern 121 is peeled off to form the third test line pattern 121 in the pixel electrode layer, as shown in FIG. 2.

In the present embodiment, the third test block pattern 111, the first test line pattern 122, the source electrode connection line 16, the drain electrode connection line 17, and the source electrodes and drain electrodes of the first and second test transistors in the non-display region are formed with the same material as the source electrode and drain electrode of the transistor in the display region and formed in a one-time patterning process at the same time that the source electrode and drain electrode of the transistor in the display region are formed. The source electrode and the drain electrode of the transistor in the display region are formed with the same material and disposed in the same layer. The first test block pattern 112, the second test line pattern 113, the fourth test line pattern 114, a first gate electrode connection line 14, a second gate electrode connection line 15, and the gate electrodes of the first and second test transistors in the non-display region are formed with the same material as the gate electrode layer in the display region and formed by a one-time patterning process at the same time that the gate electrode layer in the display region is formed. The second test line pattern 123 and the active layers of the first and second test transistors in the non-display region are formed with the same material as the active layer in the display region and formed by a one-time patterning process at the same time that the active layer in the display region is formed. The third test line pattern 121 in the non-display region are formed with the same material as the pixel electrode in the display region and formed by a one-time patterning process at the same time that the pixel electrode in the display region is formed. The fourth test line pattern 124 in the non-display region is formed with the same material as the dielectric layer in the display region and formed by a one-time patterning process at the same time that the dielectric layer in the display region is formed. In this way, the test unit can be formed in the non-display region at the same time that respective film layers are formed in the display region are formed in the display region without performing additional manufacturing process step, thus the manufacturing cost of the array substrate is reduced.

Another embodiment of the present invention provides an array substrate which is different from the above embodiment in that the test unit in this embodiment includes only one test component which may be a first test component, a second test component, a third test component, or a fourth test component. Alternatively, the test component may be another test component that is disposed in a manner similar to that of the first test component, the second test component, the third test component, or the fourth test component.

In this embodiment, the test unit may or may not include a test transistor. In the case where the test unit includes a test transistor, the gate electrode, the source electrode and the drain electrode of the test transistor may be connected to different test block patterns or test line patterns, respectively, and test signals may be inputted from the test block pattern or the test line pattern. Alternatively, the gate electrode, the source electrode, and the drain electrode of the test transistor may be not connected to the test block pattern or the test line pattern, and a test signal may be input directly from an external test device.

It should be noted that in other embodiments of the present disclosure, the test unit may also include two, three or more than five test components, each of the test components being arranged in a similar manner to that of the first test component, the second test component, the third test component, or the fourth test component in the above described embodiment.

Using different test components, it is possible to test the pattern sizes of the pattern layers arranged in any two different layers within the display region and the overlapping between any two layers of the multiple pattern layers so as to realize an integrated test of the pattern sizes and overlapping between any two layers of the plurality of pattern layers in the display region.

In the array substrates according to the embodiments of the present disclosure, an integration test of the pattern sizes of the multiple pattern layers and the degree of overlapping between any two layers of the multiple pattern layers in the display region can be realized by providing the test components and test transistors, and by disposing the orthographic projection of the test line pattern on the array substrate surrounding the periphery of the orthographic projection of the test block pattern on the array substrate. In addition, the integration test of the transistor characteristics in the display region can be achieved by connecting the test transistor to the test block pattern or the test line pattern, thus the process property of forming each pattern layer in the display region can be tested without providing more independent test elements, thereby saving the space occupied by the test unit in the non-display region and reducing the test cost. Further, with an integration arrangement of the test component and the test transistor in the test unit, during a test is performed by the test unit using test equipment, various performance of the array substrate can be effectively tested without frequently moving the test equipment, thereby improving the time effectiveness of the test.

The embodiment of the present disclosure also provides a display device including the array substrate in the above-described embodiment.

By using the array substrate according to the embodiment of the present disclosure, not only the cost of testing the process capability of manufacturing the display device is reduced, but also the time effectiveness of testing the process capability of manufacturing the display device is improved.

The display device may be any product or component with display functions, such as a mobile phone, a tablet computer, a television set, a display, a notebook computer, a digital photo frame, a navigator, or the like.

It is to be understood that the above embodiments are merely exemplary embodiments employed for the purpose of illustrating the principles of the present disclosure, but the present disclosure is not limited thereto. It will be apparent to those skilled in the art that various changes and modifications can be made therein without departing from the spirit and spirit of the present disclosure, and such changes and modifications are also regarded to be within the scope of the present disclosure.

What is claimed is:

1. An array substrate, comprising:
multiple pattern layers disposed in a display region, and a test unit disposed in a non-display region,
the test unit comprises at least one test component and at least one test transistor,
wherein the test component comprises a test block pattern and a test line pattern;
the test block pattern is disposed in the same layer as one layer of the multiple pattern layers, the test line pattern is disposed in the same layer as one layer of the multiple pattern layers, and the test block pattern and the test line pattern are disposed in different layers;
an orthographic projection of the test line pattern on the array substrate surrounds the periphery of an orthographic projection of the test block pattern on the array substrate;
the test block pattern or the test line pattern is connected to the test transistor;
wherein the test unit comprises two test components, the test transistor comprises a first test transistor and a second test transistor, a channel size of the first test transistor is different from that of the second test transistor, and the channel size is selected from the group consisting of a length, a width, and a width-to-length ratio;
the test unit further comprises a first gate connection line connected to the gate electrode of the first test transistor and a second gate connection line connected to the gate electrode of the second test transistor; and
the test block pattern or the test line pattern of the two test components is connected respectively to the first gate connection line and the second gate connection line.

2. The array substrate of claim 1, wherein the orthographic projection of the test line pattern on the array substrate is spaced from the orthographic projection of the test block pattern on the array substrate.

3. The array substrate of claim 1, wherein the multiple pattern layers comprise at least two pattern layers selected from the group consisting of a source/drain electrode layer, a transparent electrode layer, a gate electrode layer, an active layer, and a dielectric layer, and the at least two pattern layers are different layers.

4. The array substrate of claim 3, wherein the multiple pattern layers comprise the source/drain electrode layer, the gate electrode layer and the active layer.

5. The array substrate of claim 4, wherein the test component comprises a first test component comprising a first test block pattern and a first test line pattern, and
the first test block pattern and the gate electrode layer are disposed in the same layer, the first test line pattern and the source/drain electrode layer are disposed in the same layer.

6. The array substrate of claim 4, wherein the test component comprises a second test component comprising a second test block pattern and a second test line pattern, and the second test block pattern and the gate electrode layer are disposed in the same layer, the second test line pattern and the active layer are disposed in the same layer.

7. The array substrate of claim 4, wherein the multiple pattern layers further comprise the transparent electrode layer, the test component comprises a third test component comprising a third test block pattern and a third test line pattern, and
the third test block pattern and the source/drain electrode layer are disposed in the same layer, the third test line pattern and the transparent electrode layer are disposed in the same layer.

8. The array substrate of claim 5, wherein the multiple pattern layers further comprise the transparent electrode layer, the at least one test component further comprises a third test component comprising a third test block pattern and a third test line pattern, and
the third test block pattern and the source/drain electrode layer are disposed in the same layer, the third test line pattern and the transparent electrode layer are disposed in the same layer.

9. The array substrate of claim 4, wherein the multiple pattern layers further comprise the dielectric layer, the test component comprises a fourth test component comprising a fourth test block pattern and a fourth test line pattern,
  the fourth test block pattern and the gate electrode layer are disposed in the same layer, and the fourth test line pattern and the dielectric layer are disposed in the same layer.

10. The array substrate of claim 6, wherein the multiple pattern layers further comprise the dielectric layer, the at least one test component further comprises a fourth test component comprising a fourth test block pattern and a fourth test line pattern, and
  the fourth test block pattern and the gate electrode layer are disposed in the same layer, the fourth test line pattern and the dielectric layer are disposed in the same layer.

11. The array substrate of claim 1, wherein the orthographic projections of the test components in the test unit on the array substrate are spaced from one another and arranged in a row.

12. The array substrate of claim 10, wherein the test transistor comprises a first test transistor and a second test transistor, a channel size of the first test transistor is different from that of the second test transistor, and the channel size is selected from the group consisting of a length, a width, and a width-to-length ratio;
  the test unit further comprises a first gate connection line connected to the gate electrode of the first test transistor and a second gate connection line connected to the gate electrode of the second test transistor; and
  the second test block pattern is connected to one of the first gate connection line and the second gate connection line, the fourth test block pattern is connected to the other of the first gate connection line and the second gate connection line.

13. The array substrate of claim 8, wherein the test transistor comprises a first test transistor and a second test transistor, a channel size of the first test transistor is different from that of the second test transistor, and the channel size is selected from the group consisting of a length, a width, and a width-to-length ratio;
  the test unit further comprises a source electrode connection line connected to the source electrodes of the first test transistor and the second test transistor and a drain electrode connection line connected to the drain electrodes of the first test transistor and the second test transistor; and
  the first test block pattern is connected to one of the source electrode connection line and the drain electrode connection line, the third test block pattern is connected to the other of the source electrode connection line and the drain electrode connection line.

14. The array substrate of claim 12, wherein active layers of the first test transistor and the second test transistor are disposed in the same layer as the active layer in the display region; and
  the gate electrodes of the first test transistor and the second test transistor, the first gate connection line and the second gate connection line are disposed in the same layer as the gate electrode layer in the display region.

15. The array substrate of claim 13, wherein active layers of the first test transistor and the second test transistor are disposed in the same layer as the active layer in the display region; and
  the source electrodes, drain electrodes of the first test transistor and the second test transistor, the source electrode connection line and the drain electrode connection line are disposed in the same layer as the source/drain electrode layer in the display region.

16. A display device, comprising an array substrate, wherein the array substrate comprises:
  multiple pattern layers disposed in a display region, and
  a test unit disposed in a non-display region,
  wherein the test unit comprises at least one test component and at least one test transistor, and the test component comprises a test block pattern and a test line pattern;
  the test block pattern is disposed in the same layer as one layer of the multiple pattern layers, the test line pattern is disposed in the same layer as one layer of the multiple pattern layers, and the test block pattern and the test line pattern are disposed in different layers;
  an orthographic projection of the test line pattern on the array substrate surrounds the periphery of an orthographic projection of the test block pattern on the array substrate; and
  the test block pattern or the test line pattern is connected to the test transistor;
  wherein the test unit comprises two test components, the test transistor comprises a first test transistor and a second test transistor, a channel size of the first test transistor is different from that of the second test transistor, and the channel size is selected from the group consisting of a length, a width, and a width-to-length ratio;
  the test unit further comprises a first gate connection line connected to the gate electrode of the first test transistor and a second gate connection line connected to the gate electrode of the second test transistor; and
  the test block pattern or the test line pattern of the two test components is connected respectively to the first gate connection line and the second gate connection line.

17. A method for manufacturing an array substrate of claim 1, comprising:
  forming multiple pattern layers in a display region, and forming a test unit in a non-display region,
  the step of forming the test unit comprises forming at least one test component and at least one test transistor, the step of forming the test component comprises forming a test block pattern and a test line pattern;
  wherein the test block pattern and one layer of the multiple pattern layers are formed by a one-time patterning process, the test line pattern and one layer of the multiple pattern layers are formed by a one-time patterning process, and the test block pattern and the test line pattern are formed in different layers;
  an orthographic projection of the test line pattern on the array substrate surrounds the periphery of an orthographic projection of the test block pattern on the array substrate; and the test block pattern or the test line pattern is connected to the test transistor;
  wherein the test unit comprises two test components, the test transistor comprises a first test transistor and a second test transistor, a channel size of the first test transistor is different from that of the second test transistor, and the channel size is selected from the group consisting of a length, a width, and a width-to-length ratio;
  the test unit further comprises a first gate connection line connected to the gate electrode of the first test transistor and a second gate connection line connected to the gate electrode of the second test transistor; and the test block pattern or the test line pattern of the two test components is connected respectively to the first gate connection line and the second gate connection line.

18. The method for manufacturing an array substrate of claim 17, wherein the orthographic projection of the test line pattern on the array substrate is spaced from the orthographic projection of the test block pattern on the array substrate.

* * * * *